(12) United States Patent
Chen

(10) Patent No.: US 8,316,340 B2
(45) Date of Patent: Nov. 20, 2012

(54) FIXING FULL-CHIP VIOLATIONS USING FLIP-FLOPS

(75) Inventor: Wen-Hao Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 234 days.

(21) Appl. No.: 12/772,814

(22) Filed: May 3, 2010

(65) Prior Publication Data

US 2011/0006840 A1 Jan. 13, 2011

Related U.S. Application Data

(60) Provisional application No. 61/225,117, filed on Jul. 13, 2009.

(51) Int. Cl.
*G06F 17/50* (2006.01)
(52) U.S. Cl. ......... 716/134; 716/113; 716/136; 716/139
(58) Field of Classification Search .................. 716/113, 716/134, 136, 139
See application file for complete search history.

(56) References Cited

U.S. PATENT DOCUMENTS

| 5,250,852 | A | * | 10/1993 | Ovens et al. ................. | 327/202 |
|---|---|---|---|---|---|
| 5,896,299 | A | | 4/1999 | Ginetti et al. | |
| 6,198,324 | B1 | * | 3/2001 | Schober ........................ | 327/202 |
| 6,425,115 | B1 | * | 7/2002 | Risler et al. ................... | 716/114 |
| 6,427,226 | B1 | * | 7/2002 | Mallick et al. ................ | 716/113 |
| 6,734,521 | B2 | * | 5/2004 | Houston ........................ | 257/500 |
| 6,895,540 | B2 | * | 5/2005 | Chen et al. .................... | 714/726 |
| 7,278,126 | B2 | | 10/2007 | Sun et al. | |
| 7,441,211 | B1 | * | 10/2008 | Gupta et al. .................. | 716/133 |
| 7,538,368 | B2 | * | 5/2009 | Yano ............................. | 257/202 |
| 7,612,577 | B2 | * | 11/2009 | Rashed et al. ................ | 326/10 |
| 7,649,395 | B2 | * | 1/2010 | Ahmadi ....................... | 327/202 |
| 7,791,389 | B2 | * | 9/2010 | Remington ................... | 327/208 |
| 2005/0280031 | A1 | * | 12/2005 | Yano ............................ | 257/202 |
| 2009/0031163 | A1 | * | 1/2009 | Rashed et al. ................ | 714/3 |
| 2009/0254874 | A1 | * | 10/2009 | Bose ............................. | 716/6 |

* cited by examiner

*Primary Examiner* — Naum Levin
(74) *Attorney, Agent, or Firm* — Slater & Matsil, L.L.P.

(57) ABSTRACT

A method of forming an integrated circuit includes providing a first design of the integrated circuit; analyzing the first design to identify a first flip-flop having setup/hold violations and a second flip-flop not having setup/hold violations; and replacing the first flip-flop with a third flip-flop having a substantially same cell delay as the first flip-flop to form a second design of the integrated circuit. The first flip-flop and the third flip-flop have different setup and hold windows.

12 Claims, 5 Drawing Sheets

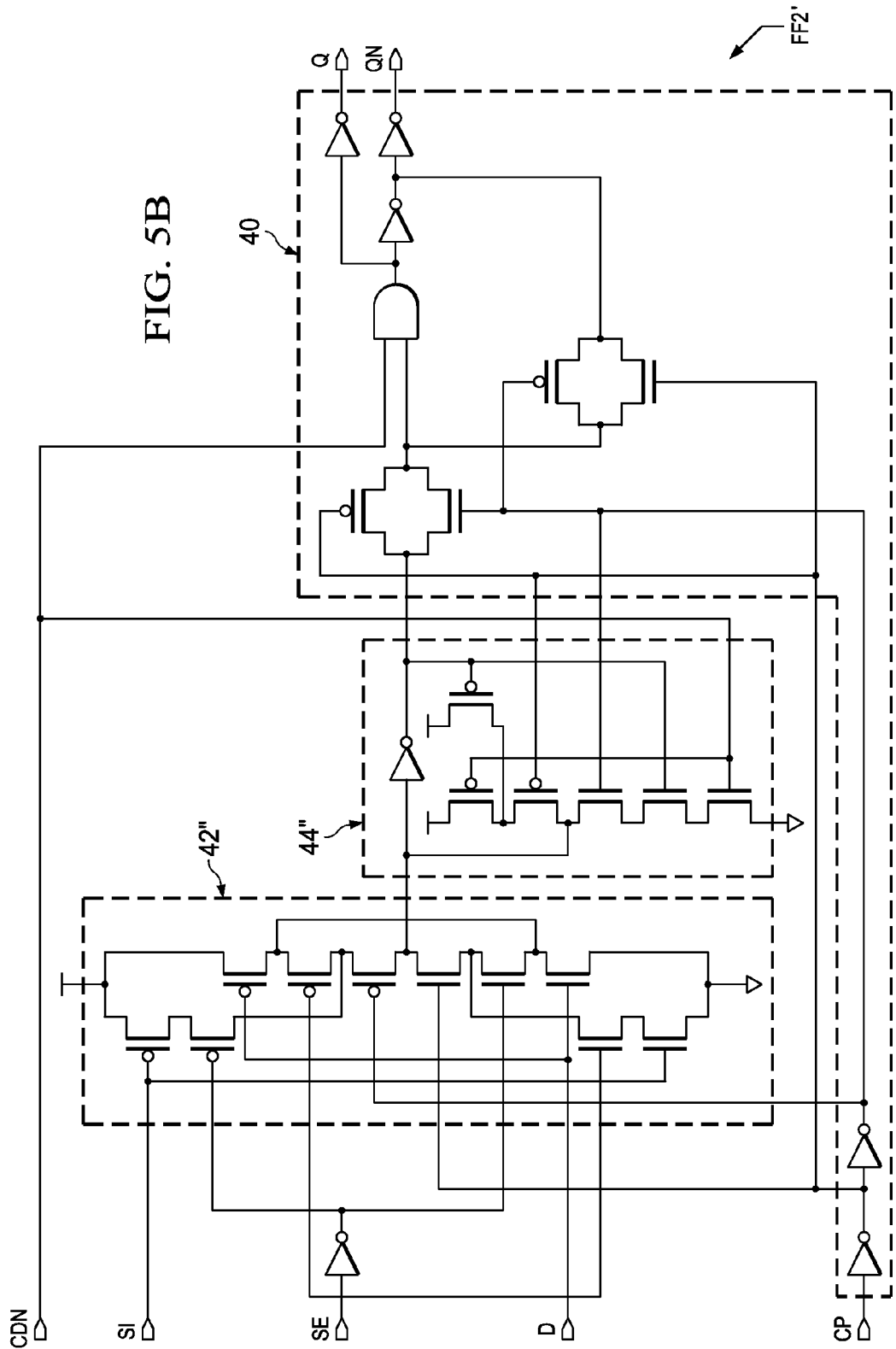

US 8,316,340 B2

FIXING FULL-CHIP VIOLATIONS USING FLIP-FLOPS

This application claims the benefit of U.S. Provisional Application No. 61/225,117 filed on Jul. 13, 2009, entitled "Fixing Full-Chip Violations Using Flip-Flops," which application is hereby incorporated herein by reference.

TECHNICAL FIELD

This invention relates generally to integrated circuit devices, and more particularly to flip-flops, and even more particularly to methods for fixing hold violations in chip design.

BACKGROUND

Flip-flops are commonly used in digital circuits for holding data. Conventionally, data are captured in flip-flops, for example, at the rising edge of the system clock. For reliable performance, the data must be received by flip-flops before the system clock comes in with a margin known as setup constraint. After the arrival of the system clock, the data must be maintained for a duration known as hold constraint. If the actual setup time is less than the setup constraint, a setup violation occurs. Similarly, if the actual hold time is less than the hold constraint, a hold violation occurs. The setup and hold violation problems need to be solved before the manufacturing of the respective integrated circuits.

Conventionally, the hold violation problem may be solved by inserting buffer(s) into the data path. By inserting the buffer(s) into the data path of a flip-flop, the arrival time of the data to flip-flops behind the inserted buffer(s) may be delayed, so that the hold time may be greater than the hold constraint. The delaying of the data may also be achieved by gate sizing or detour routings. However, these methods result in problems such as increased power, increased chip area usage, and setup issues such as increased noise-induced delay.

Another method for fixing the hold violation problem is to adjust clock skewing, so that the system clock may arrive earlier, which may also increase the actual hold time to greater than the hold constraint. However, this may have ripple effects to other parts of a respective clock tree, and new hold violations may be generated in other parts of the integrated circuit. Further, timing closure iterations may be needed to solve any newly generated violations. This significantly increases the design cycle time and cost.

SUMMARY OF THE INVENTION

In accordance with one aspect of the embodiment, a method of forming an integrated circuit includes providing a first design of the integrated circuit; analyzing the first design to identify a first flip-flop having setup/hold violations and a second flip-flop not having setup/hold violations; and replacing the first flip-flop with a third flip-flop having a substantially same cell delay as the first flip-flop to form a second design of the integrated circuit. The first flip-flop and the third flip-flop have different setup and hold windows.

Other embodiments are also disclosed.

BRIEF DESCRIPTION OF THE DRAWINGS

For a more complete understanding of the present invention, and the advantages thereof, reference is now made to the following descriptions taken in conjunction with the accompanying drawings, in which:

FIG. 5B illustrates an exemplary circuit diagram of a flip-flop shown in FIG. 4B.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel integrated circuit structure including flip-flops and the method of designing the same are presented. The intermediate stages of the design process are discussed. The variations of the embodiment are then discussed. Throughout the various views and illustrative embodiments of the present invention, like reference numbers are used to designate like elements.

Figure 1:
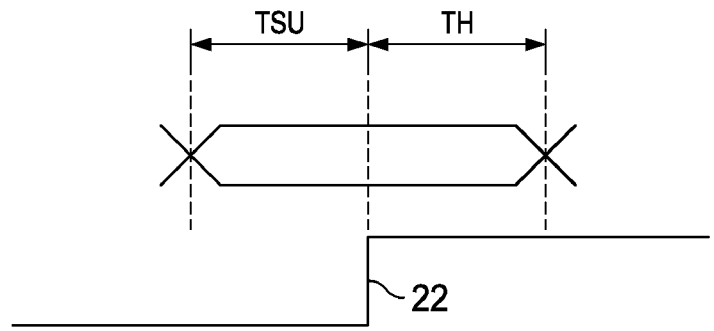
FIG. 1 illustrates a setup and hold window of a first flip-flop in accordance with an embodiment.

FIG. 1 illustrates a setup and hold window (alternatively referred to as a setup/hold window hereinafter) of a flip-flop. Setup constraint TSU and hold constraint TH indicate the timing requirements on the flip-flop with respect to clock 22. Setup constraint TSU is the time that the data must be valid before the flip-flop samples at the system clock time at clock 22. Hold constraint TH is the time that data must be maintained valid after the system clock time at clock 22. Setup constraint TSU and hold constraint TH define a window of time that the data must be valid and stable in order to assure valid data sampling by the flip-flop. If the setup time of a flip-flop is smaller than setup constraint TSU, a setup violation occurs. If the hold time of a flip-flop is smaller than hold constraint TH, a hold violation occurs.

Figure 2A:
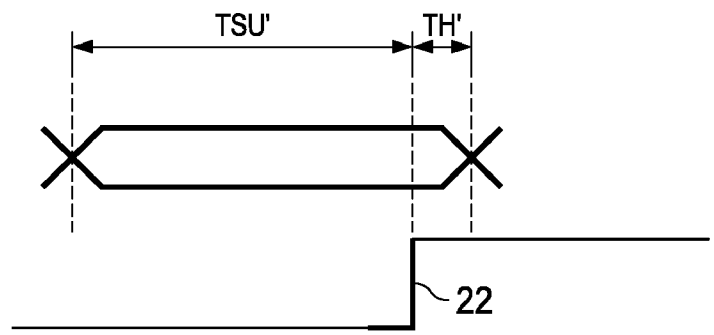
FIG. 2A illustrates a setup and hold window of a second flip-flop in accordance with an embodiment, wherein the hold constraint of the second flip-flop is smaller than that of the first flip-flop.

In the design of integrated circuits, situations may arise in which some flip-flops in an integrated circuit (a same chip) do not have setup or hold violations, while some other flip-flops in a same chip, in a same integrated circuit, or even in a same serially connected flip-flop chain (may have other logic circuits in between), may have setup or hold violations. This may be caused by the context of the flip-flops, which includes the surrounding environment such as logic design, well regions, polysilicon connections and the like. FIG. 2A illustrates a setup/hold window in accordance with an embodiment of the present invention, which is used to fix hold violations. In FIG. 2A, the data skew and/or the clock skew may be adjusted, for example, by reducing the clock delay or increasing the data skew. The adjustment of the data skew and/or the clock skew are performed at cell level (or inside each of the flip-flops), that is, for individual flip-flops rather than for all flip-flops in an integrated circuit or a chip.

Assuming the actual hold time of the flip-flop is less than hold constraint TH, the hold violation occurs. To solve the hold violation, a flip-flop having the setup/hold window as shown in FIG. 2A is designed, in which hold constraint TH' is reduced to less than hold constraint TH as shown in FIG. 1. The reduced hold constraint TH' may be reduced to a level less than the actual hold time, and hence the hold violation is solved. A side effect is that setup constraint TSU' may be increased to a value greater than setup constraint TSU as shown in FIG. 1. In an exemplary embodiment, hold constraint TH' is smaller than hold constraint TH by more than about 15 pico-seconds, or even more than about 150 pico-second. The reduction of the hold constraint from TH to TH' may be achieved by modifying the internal cell design (such as the layout) of the flip-flops.

Figure 2B:
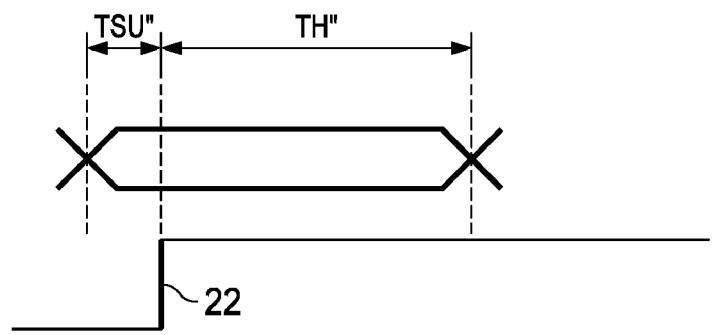
FIG. 2B illustrates a setup and hold window of a third flip-flop in accordance with an embodiment, wherein the setup constraint of the third flip-flop is smaller than the setup constraint of the first flip-flop.

Similarly, assuming the actual setup time of the flip-flop is less than setup constraint TSU, a setup violation occurs. To solve the setup violation, a flip-flop having the setup/hold window as shown in FIG. 2B is designed, in which setup constraint TSU" is reduced to less than setup constraint TSU as shown in FIG. 1. Setup constraint TSU" may be less than the actual setup time, and hence the setup violation is solved. A side effect is that hold constraint TH" may be increased to a value greater than hold constraint TH as shown in FIG. 1. In an exemplary embodiment, setup constraint TSU" is smaller than setup constraint TSU by more than about 15 pico-seconds, or even more than about 150 pico-seconds. The reduction of the setup constraint from TSU to TSU" may be achieved by modifying the internal cell design (such as the layout) of the flip-flops.

Figure 3:
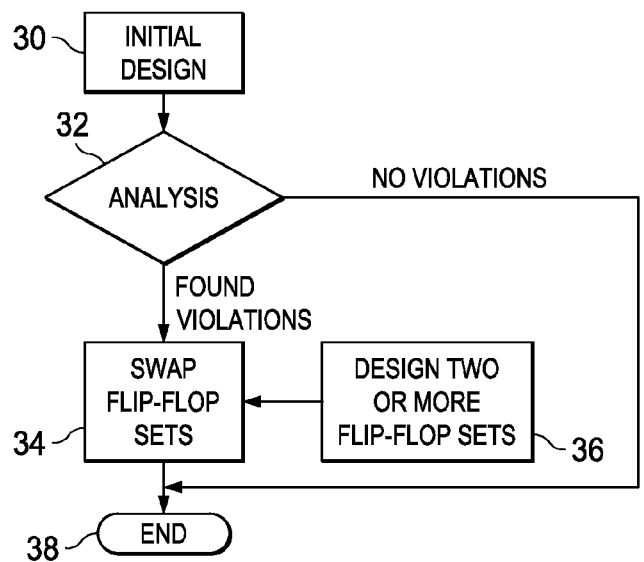
FIG. 3 illustrates a flow chart of a process for reducing/eliminating violations in flip-flops.
Figure 5A:
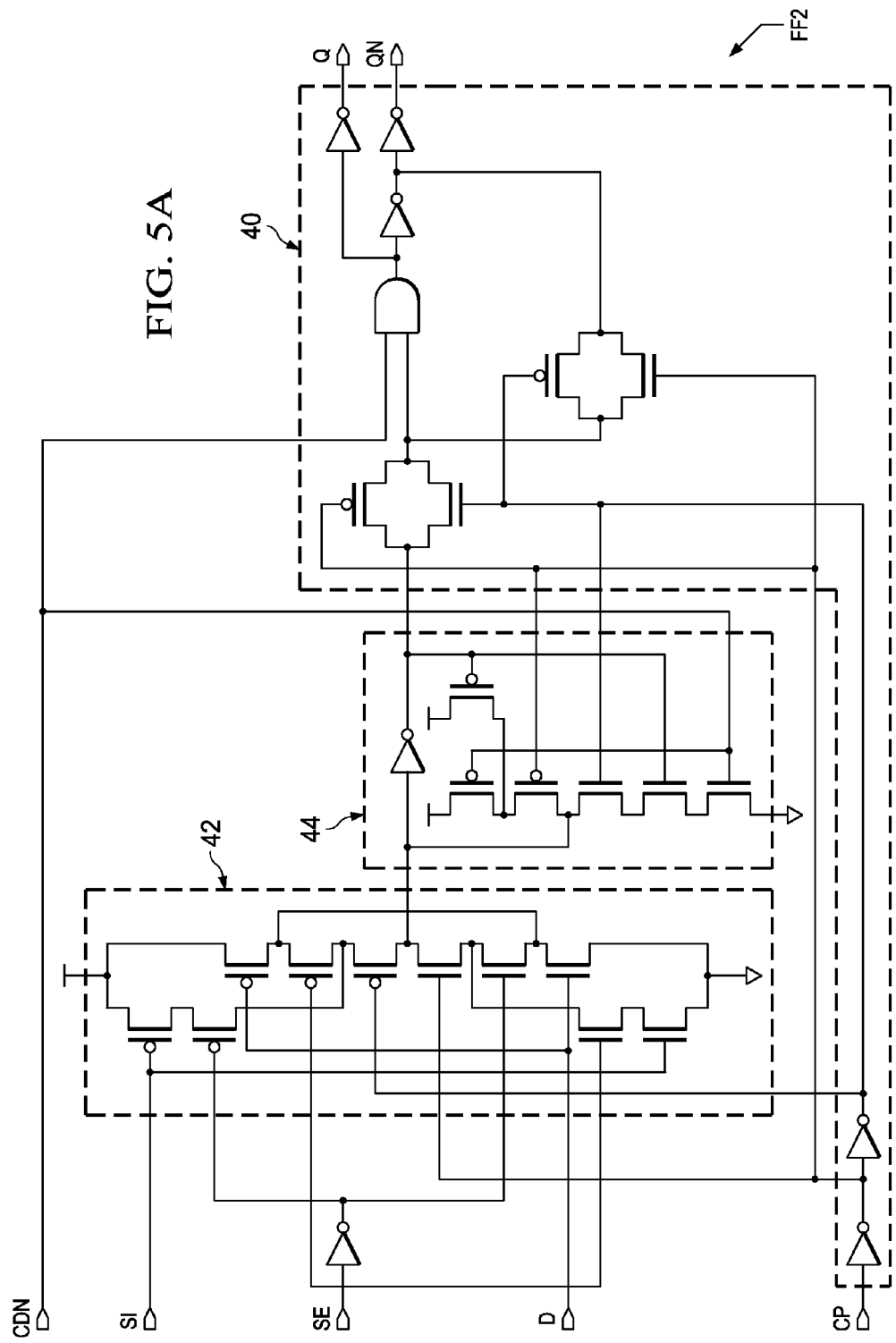
FIG. 5A illustrates an exemplary circuit diagram of a flip-flop shown in FIG. 4A.

FIG. 3 illustrates a flow chart for analyzing and fixing setup/hold violations in accordance with an embodiment. First, an integrated circuit including a plurality of flip-flops is designed (step 30). As a result, an integrated circuit design, which may be in the form of a circuit layout, is obtained. FIG. 5A schematically illustrates a schematic diagram of a flip-flop portion of the integrated circuit including a plurality of flip-flops. The setup/hold window of the flip-flops may be as shown in FIG. 1. Next, an analysis is performed (step 32) to find out whether the flip-flops have setup violations and/or hold violations, wherein the setup time and hold time of each of the flip-flops are simulated and compared to the setup/hold window as shown in FIG. 1. Assuming in analysis step 32 that no setup and hold violations are found, the violation-fixing process will be ended (step 38).

Figure 4A:
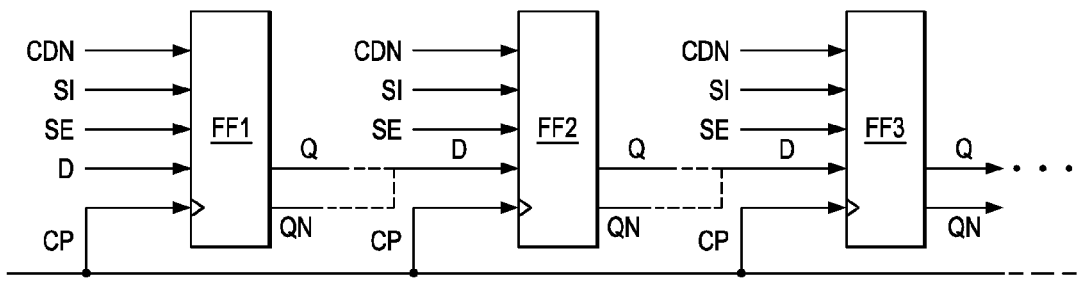
FIG. 4A illustrates a plurality of flip-flops connected in series.
Figure 4B:
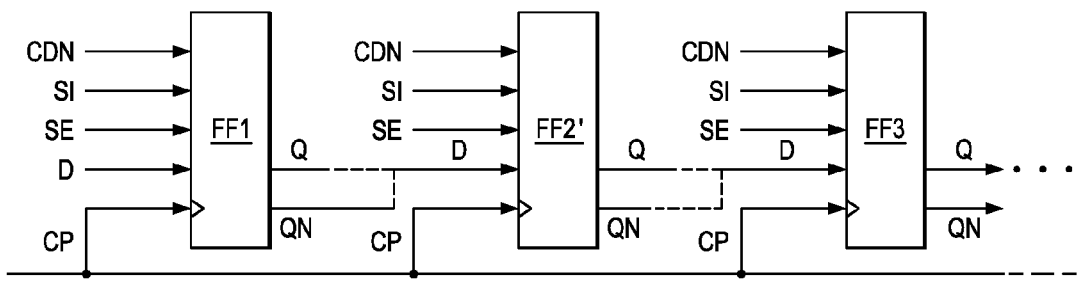
FIG. 4B illustrates a plurality of flip-flops connected in series, wherein one of the flip-flops in FIG. 4A is swapped with a flip-flop having a different setup/hold constraint window.

In an exemplary embodiment, the integrated circuit that is designed in step 30 and analyzed in step 32 includes a series of flip-flops, which may be serially connected (or may have other logic devices in between), as shown in FIG. 4A. The series of flip-flops may be identical to each other, or may have substantially the same but slightly different structures. In other embodiments, the flip-flops are not connected in series, and may belong to different circuits. In FIG. 4A, the flip-flops are denoted as FF1, FF2, FF3, and the like, wherein the input (for example, input D) of a flip-flop is connected to an output (for example, output Q) of a preceding flip-flop directly or through other logic gates. It is noted that although scan flip-flops are used as examples to explain the concept of the present invention, the teaching may also be applied to any other type of flip-flops including, but not limited to, D flip-flops, T flip-flops, J-K flip-flops, and the like. Assume in analysis step 32 (FIG. 3) that flip-flop FF2 is identified as having a hold violation, while other flip-flops do not have hold violations. Flip-flop FF2 is thus replaced (swapped, step 34 in FIG. 3) by flip-flop FF2', which has the setup/hold window as shown in FIG. 2A. The block diagram of the resulting circuit is shown in FIG. 4B.

Referring to FIG. 3, in step 36, two sets of flip-flops are designed and laid out, with one set having the setup/hold constraint window as shown in FIG. 1, and the other set having the setup/hold constraint window as shown in FIG. 2A. The first set may be used in the initial design (step 30, also shown as FF2 in FIG. 4A), while the second set may act as the replacing set shown as FF2' in FIG. 4B. Since hold constraint TH' in FIG. 2A is smaller than hold constraint TH in FIG. 1, through appropriate design of flip-flop FF2', flip-flop FF2' is very likely not to have any hold violation, or, at least, the hold violation of flip-flop FF2' is less severe than that of flip-flop FF2. Other flip-flops in the same chip having the hold violations may also be replaced by flip-flop FF2' to form a new integrated circuit design (layout). On the other hand, flip-flops FF1, FF3, and other flip-flops that do not have any hold violations may not be replaced in the newly formed integrated circuit design. If there is more than one type of flip-flop such as D flip-flops, T flip-flops, scan flip-flops, J-K flip-flops, and the like, each type may have its own replacing set, with the original one having a greater hold constraint, and a replacing one having a smaller hold constraint.

To reduce the overhead in the replacing of flip-flop FF2 with flip-flop FF2', flip-flops FF2 and FF2' preferably have a same footprint, so that the replacement may be seamlessly performed without affecting any of the surrounding circuits. The same footprint means that flip-flops FF2 and FF2' have a same cell size. In addition, the pin locations of flip-flops FF2 and FF2' are preferably the same. In other words, if flip-flops FF2 and FF2' are placed overlapping each other, their corresponding pins overlap each other.

It is realized that since the fixing of the hold violations is performed at the cell level, wherein no buffer is inserted, and no external clock skewing is performed, the fixing of flip-flop FF2 will not affect the operation of other flip-flops, and no new hold violation will be generated. Accordingly, after the swapping is done for all flip-flop candidates with hold violations, the analysis of the timing of the flip-flops for cell swapping may be ended (step 38).

As shown by the dotted lines, output Q of one flip-flop (such as flip-flop FF1) may have its output node Q connected to the data input D of a following flip-flop (such as flip-flop FF2) in the chain. The connection may be a direct connection with no other devices therebetween. Alternatively, the connection from output Q to input D may be through other devices. In other embodiments, instead of having output Q of a flip-flop connected/coupled (directly or through other devices) to input D of a following flip-flop, the output QN of a flip-flop may be connected/coupled (directly or through other devices) to input D of the following flip-flop.

FIGS. 5A and 5B illustrate exemplary circuit diagrams of scan flip-flops FF2 and FF2', respectively. Referring to FIG. 5A, flip-flop FF2 comprises input nodes including clock input CP, data input D, scan input SI, scan-enable input SE, and reset input CDN. The signal on scan-enable input SE determines whether the input data from data input D or from scan input SI is used. The selection of data input D and scan input SI is performed by multiplexer 42. The output nodes include Q and QN, which have opposite phases. Flip-flops FF2 and FF2' may be represented by the same circuit diagram. However, they may have different layouts.

To ensure that the swapping of flip-flops FF2 and FF2' will not affect the timing of other circuits, the cell delay of flip-flops FF2 and FF2' need to be kept the same. The cell delay is the time period between when a clock time (for example, time at clock 22 in FIG. 2A) arrives at clock input CP and the time the corresponding output data is outputted to output nodes Q and/or QN. In an embodiment, as shown in FIG. 5A, the cell delay is affected by the devices in cell-delay path 40. Accordingly, the circuit and the layout of flip-flop FF2 may be identical, or substantially identical, to that of flip-flop FF2', with the cell-delay difference between flip-flops FF2 and FF2' being less than about 20 percent, or even less than about 2 percent.

Figure 6:
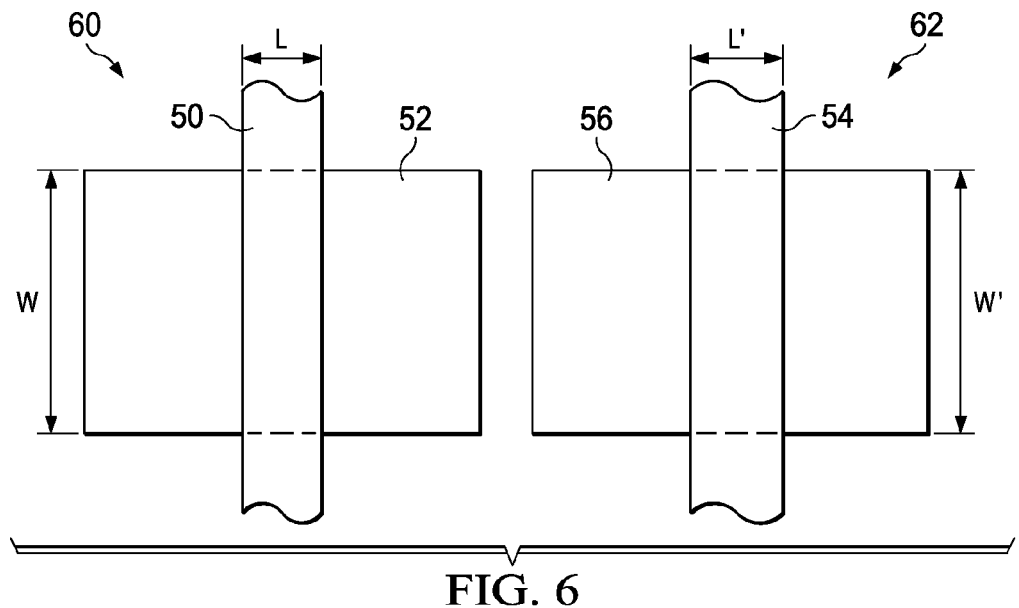
FIG. 6 illustrates a top view of layouts of the transistors in FIG. 5A and/or FIG. 5B.

Flip-flop FF2 also has cell-window-related circuits, wherein the term "cell-window" refers to the setup/hold window. For example, in FIG. 5A, the design (including the circuit connection and the layout) of multiplexer 42 affects the setup/hold window. Throughout the description, the term "cell-window-related circuits" refers to the circuits affecting only the cell-windows, but not the cell delay. Accordingly, any devices/circuits in cell-delay path 40 are not considered as being cell-window-related circuits regardless of whether they actually affect the cell window or not. Multiplexer 42 may be modified to form multiplexer circuit 42' as shown in FIG. 5B. In an exemplary embodiment, multiplexers 42 and 42' have the same circuit diagram, as shown in FIGS. 5A and 5B, but have different layouts. For example, their transistors represented by the same transistor in the circuit diagram have different gate dimensions. FIG. 6 illustrates an exemplary top view of transistor 60, which may be a transistor in multiplexer 42 in flip-flop FF2 in FIG. 4A, and in flip-flop FF1 in FIG. 4B. FIG. 6 also illustrates the top view of transistor 62, which may be a transistor in multiplexer 42' in flip-flop FF2' in FIG. 4B. Please note that transistors 60 and 62 correspond to each other, that is, they are represented by a same transistor in the circuit diagram, although they are in different flip-flops.

Throughout the description, when the term "corresponding" is used to describe that a first gate dimension of a first transistor corresponds to a second gate dimension of the second transistor, either the first and the second dimensions are both gate widths, or are both gate lengths. Transistor 60 has gate 50 and active region 52, while transistor 62 has gate 54 and active region 56. Gate width W' of transistor 62 may be smaller than the corresponding gate width W in transistor 60. In an exemplary embodiment, gate width W' may be smaller than gate width W by greater than about 1 percent, or even by greater than about 25 percent. Gate length L' of transistor 62 may be greater than gate length L in transistor 60. In an exemplary embodiment, gate length L' may be greater than gate length L by greater than about 1 percent, or even by greater than about 20 percent. By reducing gate widths and/or increasing gate lengths of transistors in the cell-window-related circuits, the hold constraint in flip-flop FF2' is smaller than that in flip-flop FF2'. In alternative embodiments, multiplexers 42 and 42' may be manufactured differently by using differentiated formation processes, such as different doping concentrations for well regions, pocket region, and the like. Other cell-window-related circuits such as latch 44 may also be replaced by latch 44', which has a different layout than latch 44. However, latches 44 and 44' but may be represented by a same circuit diagram. Alternatively, latch 44 may be identical to latch 44' in layouts.

After the swapping of flip-flops, the integrated circuit as shown in FIG. 5B may have two flip-flops represented by the circuit diagram, but may have different cell windows co-existing in a same chip, in a same functional circuit, or even in a same series of flip-flops. After the swapping of flip-flops, as shown in steps 34 and 38 in FIG. 3, the design of the integrated circuit in FIG. 5B may be ended, and the integrated circuit may be manufactured, for example, on a semiconductor wafer/chip.

Although in the preceding paragraphs, the embodiments for solving hold violations are discussed, the method may be used to solve setup violations. Accordingly, similar to the method as shown in FIG. 3, two sets of circuit designs (such as two sets of layouts that can be represented by a same circuit diagram) having different setup constraints may be formed. The initial circuit design may adopt a greater setup constraint, as shown in FIG. 1. After analysis, the flip-flops having setup violations or setup-sensitive flip-flops may be replaced with the flip-flops having smaller setup constraints, as shown in FIG. 2B. Similar to FIG. 5B, the cell-window-related circuits may be modified, for example, by increasing the respective gate widths and/or reducing the gate lengths of the transistors. The method as shown in FIG. 3 may be used to optimize circuit design, for example, after analysis, setup-sensitive paths that are more likely to malfunction if they have setup violations may use the circuit as shown in FIG. 1 and FIG. 5A, while hold-sensitive paths that are more likely to malfunction if they have hold violations may use the circuit as shown in FIG. 2 and FIG. 5B.

The embodiments of the present invention have several advantageous features. Since the fixing of setup and hold violations is performed at cell level, no ripple effect occurs, and hence fewer timing closure iterations are needed. In addition, since no additional buffers are inserted, there is no additional power consumption. Further, with the expectation that the fixing of setup and hold violations will not require additional chip area, in the initial design, no chip area needs to be reserved, and hence the chip-area usage of the flip-flops is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:
1. A method comprising:
providing an integrated circuit comprising a plurality of flip-flops, wherein the plurality of flip-flops is represented by a substantially same circuit diagram;
providing a first flip-flop layout for the plurality of flip-flops, wherein the first flip-flop layout has a first hold constraint;
providing a second flip-flop layout for the plurality of flip-flops, wherein the second flip-flop layout has a second hold constraint smaller than the first hold constraint, and wherein the first flip-flop layout and the second flip-flop layout have a substantially same cell delay;

designing a first circuit layout for the integrated circuit using the first flip-flop layout to implement the plurality of flip-flops;

analyzing the first circuit layout to identify a first flip-flop in the plurality of flip-flops having a hold violation; and replacing the first flip-flop layout of the first flip-flop with the second flip-flop layout to form a second circuit layout for the integrated circuit, wherein the step of replacing the first flip-flop layout with the second flip-flop layout is performed by a computer.

2. The method of claim 1, wherein, in the step of analyzing the first circuit layout, a second flip-flop in the plurality of flip-flops not having any hold violation is identified, and wherein, during the step of replacing the first flip-flop layout, the second flip-flop is not replaced.

3. The method of claim 1, wherein a transistor in the first flip-flop layout has a greater gate width than the transistor in the second flip-flop layout, or wherein the transistor in the first flip-flop layout has a smaller gate length than the transistor in the second flip-flop layout.

4. The method of claim 1, wherein after the step of replacing the first flip-flop layout with the second flip-flop layout, the first flip-flop layout is removed from the second circuit layout.

5. The method of claim 1, wherein the first flip-flop layout and the second flip-flop layout have substantially a same cell size and substantially same pin locations.

6. The method of claim 1 further comprising forming an integrated circuit on a chip, wherein the integrated circuit comprises the second circuit layout.

7. An integrated circuit comprising:
a chip comprising:
  a first flip-flop; and
  a second flip-flop having a same circuit diagram as the first flip-flop, wherein the first flip-flop and the second flip-flop are coupled in series, wherein each of the first flip-flop and the second flip-flop comprises a cell-delay path and a cell-window-related path, wherein a first transistor in the cell-window-related path of the first flip-flop has a first gate dimension different from a second gate dimension of a second transistor in the cell-window-related path of the second flip-flop, wherein the first gate dimension and the second gate dimension are corresponding dimensions, and wherein the first transistor and the second transistor are represented by a same transistor in the same circuit diagram.

8. The integrated circuit of claim 7, wherein the first gate dimension is a first gate width and the second gate dimension is a second gate width, and wherein the first gate width is greater than the second gate width.

9. The integrated circuit of claim 7, wherein the first gate dimension is a first gate length and the second gate dimension is a second gate length, and wherein the first gate length is smaller than the second gate length.

10. The integrated circuit of claim 7, wherein a layout of the cell-delay path of the first flip-flop is identical to a layout of the cell-delay path of the second flip-flop.

11. The integrated circuit of claim 10, wherein the first flip-flop has a first setup/hold window different from a second setup/hold window of the second flip-flop.

12. The integrated circuit of claim 7, wherein the first flip-flop and the second flip-flop have substantially a same cell size and substantially same pin locations.

\* \* \* \* \*